United States Patent Office 3,600,216
Patented Aug. 17, 1971

3,600,216

PROCESS FOR ADHERING POLY-p-XYLYLENE TO SUBSTRATES USING SILANE PRIMERS AND ARTICLES OBTAINED THEREBY

Donald D. Stewart, Plainfield, N.J., assignor to Union Carbide Corporation, New York, N.Y.

No Drawing. Filed Sept. 6, 1968, Ser. No. 758,136
Int. Cl. B44d *1/14;* B32b *27/06*
U.S. Cl. 117—72 30 Claims

ABSTRACT OF THE DISCLOSURE

This invention relates to the adhesion of vapor deposited poly-p-xlylene to solid substrates through the use of ethylenically unsaturated silicon compounds having at least one hydrolyzable and or condensible group.

BACKGROUND

This invention relates to the use of an adhesion promoter for adhering poly(p-xylylene) to substrate surfaces. More particularly, this invention relates to the coating of vapor deposited poly(p-xylylene) onto substrate surfaces and the improved adhesion thereto by use of a substituted silicon compound.

An important problem encountered in the commercial application of poly(p-xylylene) has been the difficulty in acquiring the adhesion of the poly(p-xylylene) to the surface of the object to be coated. The poly(p-xylylene) family of polymers do not exhibit satisfactory adhesion to a wide variety of substrate surfaces such as metals, ceramics and plastics. In the past, specific treatments, such as HCl treatment on copper, have promoted poly(p-xylylene) adhesion. However, such specific treatment was found applicable only to that particular material and was not applicable for adhesion to dissimilar types of substrates. Thus, the problem of poly(p-xylylene) adhesion is complicated by the necessity of acquiring adhesion to a variety of substrates using the same adhesion technique.

A primary area of interest for poly(p-xylylene) coating is the electronics field where the substrates consist of a combination of materials such as plastics, metals and ceramics. In this field, adhesion must be obtained without impairing the poly(p-xylylene) coating process while maintaining the necessary electrical properties of the electrical and electronic components of the coated substrates. Adhesives, such as tacky gums applied by solvent dipping are not desirable due to their impairment of the poly(p-xylylene) process. The adhesion must be acquired using an adhesion promoter to effect chemical bonding between the substrate and the poly(p-xylylene).

Known procedure used for obtaining adhesion using adhesion promoters normally require such techniques as treatment of the substrate with an adhesion promoter followed by lamination of a polymer with heat and pressure; or reaction of a liquid or solid on an adhesion promoted surface, such as curing of epoxies which generate heat during cure; or incorporation of the adhesion promoter in the liquid or solid, such as epoxies, prior to the polymerization on a substrate surface with generation of heat from the polymerization reaction. Further limitation is thus found in obtaining an adhesion promoter which could be applied without impairing the vapor deposition coating process of p-xylylene that is conventionally employed.

SUMMARY

Now in accordance with the present invention it has been found that poly-p-xylylene can be adhered to substrates by the method comprising providing on the surface of the substrate a siloxane containing an ethylenically unsaturated group bonded to the silicon of the siloxane by a carbon-to-silicon bond, contacting the substrate with a vaporous p-xylylene diradical which upon deposition on the surface of the substrate forms a poly-p-xylylene coating which adheres to the substrate surface.

This invention also relates to a substrate treated with a solution formed from a substituted silicon compound containing an ethylenically unsaturated group bonded to the silicon of the silicon compound by a carbon-to-silicon bond and at least one hydrolyzable group attached directly to the silicon of the silicon compound, and coated with vapor deposited poly-p-xylylene adhered thereto.

DESCRIPTION

The reactive vaporous diradicals hereinabove mentioned can be produced by the pyrolytic cleavage of at least one cyclic dimer represented generally by the structure

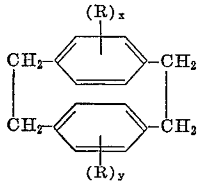

wherein R is an aromatic nuclear substituent, $x$ and $y$ are integers from 0 to 3, inclusive, thus forming 2 separate reactive vaporous diradicals having the structure:

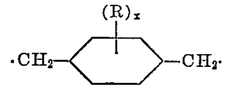

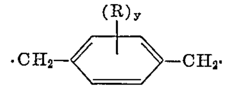

Thus, where $x$ and $y$ are the same, and the aromatic nuclear substituent on each diradical is the same, two moles of the same p-xylylene diradical are formed, and when condensed yield a substituted or unsubstituted p-xylylene homopolymer. When $x$ and $y$ are different or the aromatic nuclear substituents on each diradical are different, condensation of such diradicals will yield copolymers as hereinafter set forth.

Inasmuch as the coupling of these reactive diradicals does not involve the aromatic ring, any unsubstituted or nuclear substituted p-xylylene polymer can be prepared since the substituent groups function essentially as inert groups. This, the substituent group can be any organic or inorganic groups which can normally be substituted on aromatic nuclei. As an illustration of such substituent groups, are such organic groups as alkyl, aryl, alkenyl, cyano, carboxyl, alkoxy, hydroxy alkyl, carbalkoxy and the like radicals, and inorganic radicals such as hydroxyl, nitro, halogen, amino, and other similar groups which are normally suitable on aromatic nuclei. Otherwise the position on the aromatic ring is filled by a hydrogen atom.

Particularly preferred of the substituted groups are those simple hydrocarbon groups, such as the lower alkyls as methyl, ethyl, propyl, butyl, hexyl, lower aryl hydrocarbons such as phenyl, alkylated phenyl, naphthyl and the like groups no more than about 10 carbon atoms, and the halogen groups particularly chlorine, bromine, iodine and fluorine.

The substituted di-p-xylylenes from which these reactive diradicals are prepared, can be prepared from the cyclic dimer di-p-xylylene, by appropriate treatment, such as halogenation, acetylation, cyanolation, alkylation, and/or oxidation and reduction and like methods of introduction of such substituent groups into aromatic nuclei. Inasmuch as the cyclic dimer is a very stable product up to temperatures of about 400° C., elevated temperature reactions can also be employed for the preparation of various substituted materials. Hereinafter the term "a di-p-xylylene" refers to any substituted or unsubstituted cyclic di-p-xylylene as hereinabove discussed.

In the polymerization process, the vaporous diradicals condense and polymerize nearly instantaneously upon the substrate at the condensation temperature of the diradicals. The coupling of these diradicals involves such low activation energy and the chain propagation shows little or no preference as to the particular diradicals, that steric and electronic effects are not important as they are in vinyl polymerization. Thus substituted and/or unsubstituted p-xylylene homopolymers can be made by cooling the vaporous diradicals down to any temperature below the condensation temperature of the diradical. It has been observed that for each diradical species, there is an optimum ceiling condensation temperature above which the diradical will not condense and polymerize. All obesrved ceiling condensation temperatures have been below about 250° C. but vary to some degree upon the operating pressure involved. For example, at 0.5 mm. Hg pressure, the following condensation and polymerizations ceilings are observed for the following diradicals.

| | Degrees centigrade |
|---|---|
| p-Xylylene | 25–30 |
| Chloro-p-xylylene | 70–180 |
| Cyano-p-xylylene | 120–130 |
| n-Butyl-p-xylylene | 130–140 |
| Iodo-p-xylylene | 180–200 |

Thus, by this process, homopolymers are made by maintaining the substrate surface at a temperature below the ceiling condensation temperature of the particular diradical species involved, or desired in the homopolymer. This is most appropriately termed "homopolymerizing conditions."

Where several different diradicals existing in the pyrolyzed mixture have different vapor pressure and condensation characteristics as for example p-xylylene, or cyano-p-xylylene and chloro-p-xylylene or any other mixture with other substituted diradicals, homopolymerization will result when the condensation and polymerization temperature is selected to be at or below that temperature where only one of the diradicals, condense and polymerize. Thus, for purposes within this application, the terms "under homopolymerization conditions" are intended to include those conditions where only homopolymers are formed. Therefore it is possible to make homopolymers from a mixture containing one or more of the substituted diradicals when any other diradicals present have different condensation or vapor pressure characteristics, and wherein only one diradical species is condensed and polymerized on the substrate surface. Of course, other diradical species not condensed on the substrate surface can be drawn through the apparatus as hereinafter described, in vaporous form to be condensed and polymerized in a subsequent cold trap.

Inasmuch as p-xylylene diradicals, for example are condensed at temperatures about 25° to 30° C., which is much lower than cyano p-xylylene diradicals, i.e., about 120° to 130° C. it is possible to have present such diradicals in the vaporous pyrolyzed mixture along with the cyano-substituted diradicals. In such a case, homo-polymerizing conditions are secured by maintaining the substrate surface at a temperature below the ceiling condensation temperature of the substituted p-xylylene but above that of the p-xylylene, thus permitting the p-xylylene vapors to pass through the apparatus without condensing and polymerizing but collecting the poly-p-xylylene in a subsequent cold trap.

It is also possible to obtain substituted copolymers through the pyrolysis process hereinabove described. Copolymers of p-xylylene and substituted p-xylylene diradicals, as well as copolymers of substituted p-xylylene diradicals wherein the substituted groups are all the same radicals but each diradical containing a differing number of substitutent groups can all be obtained through said pyrolysis process.

Copolymerization occurs simultaneously with condensation upon cooling of the vaporous mixture of reactive diradicals to a temperature below about 200° C. under polymerization conditions.

Copolymers can be made by maintaining the substrate surface at a temperature below the ceiling condensation temperature of the lowest boiling diradical desired in the copolymer, such as at room temperature or below. This is considered "copolymerizing conditions," since at least two of the diradicals will condense and copolymerize in a random copolymer at such temperature.

In the pyrolytic process, the reactive diradicals are prepared by pyrolyzing a substituted and/or unsubstituted diparaxylylene at a temperature less than about 700° C., and preferably at a temperature between about 550° C. to about 600° C. At such temperatures, essentially quantitative yields of the reactive diradicals are secured. Pyrolysis of the starting di-p-xylylene begins at about 450° C. regardless of the pressure employed. Operation in the range of 450°–550° C. serves only to increase time of reaction and lessen the yield of polymer secured. At temperature above about 700° C., cleavage of the substituent group can occur, resulting in a tri- or polyfunctional species causing cross-linking or branched polymers.

Pyrolysis temperatures is essentially independent of the operating pressure. It is however preferred that reduced or subatmospheric pressures be employed. For most operations, pressures within the range of 0.0001 to 10 mm. Hg absolute are most practical. However, if desired, greater pressures can be employed. Likewise, if desirable, inert vaporous diluents such as nitrogen, argon, carbon dioxide, steam and the like can be employed to vary the optimum temperature of operation or to change the total effective pressure in the system.

It is well known that siloxanes can be condensed and hydrolyzed products of substituted silanes. Such compounds can be prepared by any convenient method known in the art. Preferably the siloxanes of the present invention are formed when reacting the silicon compound containing solution with hydroxyl or oxide surface groups of the substrate.

The siloxanes hereinabove mentioned can be produced from substituted silanes represented generally by the structure $$\begin{array}{c} R_a' \\ | \\ R\text{—}SiX_{2-a} \end{array}$$

wherein R is an ethylenically unsaturated group bonded to the silicon by a carbon-to-silicon bond such as those compounds having the structure $$\begin{array}{l} \quad\;\; CH_3 \;\; O \\ \quad\;\;\; | \quad\;\; \| \\ CH_2{=}C{—}C{—}OCH_2CH_2CH_2{—} \end{array}$$

$$CH_2{=}CHCOOH_2CH_2CH_2\text{—and}$$

$$CH_2{=}CH(CH_2)_{0-1}\text{—}$$

R′ is a monovalent hydrocarbon group bonded to silicon by a carbon to silicon bond; X is a hydrolyzable and/or condensible radical such as halogen, alkoxy, aryloxy, acyloxy and the like; and *a* is 0, 1, or 2. Specific illustrations of such substituted silanes containing an ethylenically unsaturated group bonded to the silicon of the silane by a carbon to silicon bond, and at least one hydrolyzable group attached directly to the silicon of the silane are vinyltrichloro silane, vinylmethyldichloro silane, and gammamethacryloxypropyltrimethoxy silane. Organo silicon compounds useful in the present invention are known in the art and can be prepared by any conventional method known in the art.

Substrates of the present invention can be any organic or inorganic solid which may take any form, such as sheet, fiber or particles. Illustrative of the organic and inorganic substrates within the purview of this invention are, by way of example, metal substates such as aluminum, iron, copper, steel, molybdenum, and the like; metal oxide substrates such as aluminum oxide, titanium oxides, lead oxides, copper oxides, iron oxides, beryllium oxides, manganese oxides, tungsten oxides, tantalum oxides, vanadium oxides, and the like; non metal inorganic oxides, such as silicon oxide (e.g. sand, fly ash, hydrated silica, silica, quartz, aerogel, xerogels, fumed silica, and the like); and solid organic substrates such as epoxy containing compounds and thermoplastic and thermosetting compounds having a lightly oxidizing surface.

Especially suitable substrates for use in the process of the present invention have been those metal, glass or organic resin substrates having hydroxyl, oxide or epoxy groups on their surfaces.

The substrate of the present invention is preferably provided on its surface with a siloxane containing an ethylenically unsaturated group bonded to the silicon of the siloxane by a carbon-to-silicon bond by treating the substrate with a solution produced by dissolving in a solvent a substituted silane containing an ethylenically unsaturated group identical to that of the siloxane and at least one hydrolyzable group attached directly to the silicon of the silane.

The solvent employed can vary with the particular silane used. The solvent can vary from halocarbons such as trichloroethylene to ethanol-water or methanol-water mixtures.

The amount of silane in solution can be from about .05% to about 20% depending upon the solvent employed. It must be understood that the solvent used and the amount of silane in solution can vary widely and such variations should not be construed as being outside the scope of this invention. Furthermore, solvents other than those specifically named as being preferred, can also be effectively employed without detracting from this invention.

It must be understood that the solution can also be formed of a siloxane containing an ethylenically unsaturated group bonded to the silicon of the siloxane by a carbon-to-silicon bond and at least one hydrolyzable and/or condensible group attached directly to the silicon of the silane.

Specific illustrations of the preferred types of solutions which can be employed are 10% solution of vinyltrichloro silane in trichloroethylene, 0.1% gamma-methacryloxypropyl trimethoxy silane in 99.4% methanol–0.5% water. These solutions have been preferred, and references to such should not be construed to limit the combinations possible in making a solution of the silicon compound.

The substrate can be treated with the aforementioned solutions by such techniques as dipping the substrate directly onto the solution, or other conventional techniques.

It is also preferred, that the treated substrate be dried at ambient temperatures to effect evaporation of the carrier solvent. In certain instances, such as when treating the substrate with a 1% solution of gamma-methacryloxypropyltrimethoxy silane in 95/5 ethanol-water it is preferable to bake the substrate at temperatures from about 50–70° C. after air drying in order to remove the residual non-reacted silane and the rest of the carrier solvent. However such baking is not always necessary but depends upon the silane and solution used.

The apparatus must suitable for producing and depositing the reactive veporous p-xylylene on the surface of the treated substrate is disclosed in U.S. Pat. 3,246,627 to Loeb et al. This patent provides a chamber adapted to receive objects to be coated, such as the treated substrates. The chamber and/or the substrate therein is maintained at a temperature below about 200° C. and below the condensation temperature of the particular p-xylylene species, as indicated above. The chamber is in communication with a vaporization-pyrolylzation oven by a labyrinthine exit passageway which emits the p-xylylene diradicals. The oven is maintained at the temperatures indicated previously for the vaporization and pyrolyzation of the di-p-xylylene. In operation, the di-p-xylylene is maintained in the oven for a period of time sufficient to pyrolyze and vaporize the di-p-xylylene to the corresponding p-xylylene diradical species. The p-xylylene diradicals are then permitted to emit into evacuated space defined by the walls of the chamber whereby the p-xylylene diradicals impinge upon the treated surface of the substrate and polymerize to form a poly(p-xylylene)coating having improved adhesion to the substrate.

Through the process of the present invention, poly(p-xylylene) has been found to have greatly improved adhesion to substrates at ambient temperatures and also in the presence of hot water.

The following examples are illustrative of the process of the present invention and it should be understood that they are not intended to be limitative thereof.

EXAMPLE 1

An epoxy-glass laminate substrate was vapor degreased with trichloroethylene for about 10 minutes. The substrate was then air dried to remove the solvent. A 0.1% by volume solution of gamma-methacryloxypropyltrimethoxy silane in 99.4% methanol-0.5% $H_2O$ was prepared and permitted to sit for 2 hours. The substrate was then dipped in the solution for 10 minutes, air dried for 30 minutes, and then baked at 70° C. for 30 minutes.

The substrate was then placed in an evacuated vapor deposition chamber of a poly(p-xylylene) polymerization unit. 10 grams of dichloro di-p-xylylene was vaporized at 160° C. at a pressure of 0.1 mm. Hg and the vapors were passed into Vycor quartz tubing heated to 650° C. to thermally cleave the dichloro di-p-xylylene to form its diradical intermediate chloro p-xylylene. The diradical was introduced into the vapor deposition chamber maintained at less than 70° C. where it condensed on the substrate surface to form a poly(chloro)p-xylylene coating of approximately 1 mil thickness. The substrate was removed from the chamber. Examination showed the poly(chloro) p-xylylene was adhered to the substrate and no further treatment was necessary.

Adhesion was maintained under normal atmospheric conditions and in boiling water for a 5 hour period.

EXAMPLE 2

Example 1 was repeated except instead of baking the heated substrate the substrate was rinsed with fresh methanol prior to being placed in the evacuated vapor deposition chamber. Excellent adhesion was obtained.

EXAMPLE 3

Example 2 was repeated using glass, aluminum and copper substrates. Excellent adhesion was obtained in each instance.

EXAMPLE 4

Example 3 was repeated using di-p-xylylene instead of di-chloro di-p-xylylene and poly(p-xylylene) was condensed on the surface at temperatures in the deposition chamber of under 25° C. Excellent adhesion of the poly (p-xylylene) to the substrate surface was obtained.

EXAMPLE 5

An epoxy-glass laminate substrate was vapor degreased with trichloroethylene for about 10 minutes. The substrate was then air dried to remove the solvent. A 0.1% by volume solution of gamma-methacryloxypropyltrimethoxy silane in 99.4% methanol-0.5% $H_2O$ was prepared and permitted to sit for 2 hours. The substrate was then dipped in the solution for 10 minutes, air dried for 30 minutes, and then baked at 70° C. for 30 minutes.

Poly(chloro)p-xylylene film formed as described in Example 1 on the inner surface of the vacuum deposition chamber. The film was removed mechanically and pressed onto the treated substrate surface at a temperature of about 100° C. and a pressure of 1000 p.s.i.g. The film did not adhere to the heated substrate.

This experiment was repeated using copper, aluminum and glass substrates. In each instance there was no adhesion.

EXAMPLE 6

Substrates of glass, aluminum, copper and epoxy-glass laminate were vapor degreased with trichloroethylene for about 10 minutes. The substrates were then air dried for 20 minutes and dipped for 1 minute in a 10% solution of vinyltrichloro silane in trichloroethylene. The substrates were then placed in a vacuum deposition chamber and coated with poly p-xylylene in the same manner as described in Example 1. Excellent adhesion of the poly p-xylylene to the substrates was obtained.

EXAMPLE 7

Example 1 was repeated using substrates of glass, aluminum and copper together with an epoxy-glass laminate substrate treated in a 0.1% solution of gamma-glycidoxypropyl trimethoxy silane in 99.4% methanol-0.5% water.

After removing the substrates from the vacuum deposition chamber, examination showed no adhesion of the poly(chloro)p-xylylene to the substrate surfaces.

EXAMPLE 8

A slightly oxidized polyethylene substrate was dipped for 1 minute in a 10% solution of vinyltrichloro silane in trichloroethylene. The substrate was then placed in a vacuum deposition chamber and coated with poly p-xylylene in the same manner as described in Example 1. Excellent adhesion of the poly chloro p-xylylene to the substrate was obtained.

What is claimed is:

1. A process for adhering poly-p-xylylene to solid substrates comprising providing on the surface of the substrate a siloxane containing an ethylenically unsaturated group bonded to the silicon of the siloxane by a carbon to silicon bond, contacting the siloxane treated substrate with a vaporous p-xylylene diradical, which upon deposition on the surface of said substrate forms a polyparaxylylene coating which adheres to said surface.

2. The process of claim 1 whereby said siloxane is provided on the surface of the substrate by treating said substrate with a solution comprising a silicon compound containing an ethylenically unsaturated group bonded to the silicon of the silicon compound by a carbon to silicon bond and at least one hydrolyzable group attached directly to the silicon of the silicon compound, and a solvent, and removing the solvent.

3. The process of claim 2 wherein the silicon compound is a siloxane containing an ethylenically unsaturated group bonded to the silicon of the silane by a carbon to silicon bond and at least one hydrolyzable and/or condensible group attached directly to the silicon of the siloxane.

4. The process of claim 2 wherein the silicon compound is a substituted silane containing an ethylenically unsaturated group bonded to the silicon of the silane by a carbon to silicon bond and at least one hydrolyzable group attached directly to the silicon of the silane.

5. The process of claim 4 wherein the silane is vinyltrichlorosilane.

6. The process of claim 4 wherein the silane is gamma-methacryloxypropyltrimethoxysilane.

7. The process of claim 4 wherein the silane is vinylmethyldichlorosilane.

8. The process of claim 4 wherein the silane is gamma-glycidoxypropyltrimethoxy silane.

9. The process of claim 1 wherein the vaporous p-xylylene diradical is produced by the pyrolytic cleavage of at least one cyclic dimer represented generally by the structure

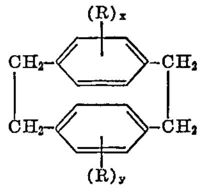

wherein R is an aromatic nuclear substituent, $x$ and $y$ are integers from 0 to 3 inclusive.

10. The process of claim 9 wherein the diradical comprises p-xylylene.

11. The process of claim 9 wherein the diradical is chloro-p-xylylene.

12. The process of claim 1 wherein the substrate has a surface hydroxyl, oxide or epoxy group thereon.

13. The process of claim 1 wherein the substrate is a metal or metal oxide.

14. The process of claim 1 wherein the substrate is glass.

15. The process of claim 1 wherein the substrate is an organic resin.

16. An article comprising a solid substrate treated with a substituted silicon compound containing an ethylenically unsaturated group bonded to the silicon of the silicon compound by a carbon to silicon bond and at least one hydrolyzable group attached directly to the silicon of the silicon compound, and coated with poly-p-xylylene.

17. An article as in claim 16 in which said poly-p-xylylene contains repeating units of the structures

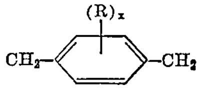

and

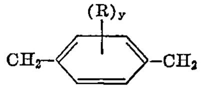

wherein R is an aromatic nuclear substituent and $x$ and $y$ are each integers from 0 to 3, inclusive.

18. An article as in claim 17 in which $x$ and $y$ are the same.

19. An article as in claim 18 in which $x$ and $y$ are each 0.

20. An article as in claim 17 in which R is selected from the group consisting of alkyl, aryl, alkenyl, cyano, carboxyl, alkoxy, hydroxy alkyl, carbalkoxy, hydroxyl, nitro and halogen groups.

21. An article as in claim 20 in which R is halogen group.

22. An article as in claim 21 in which $x$ and $y$ are each 1.

23. An article as in claim 22 in which R is Cl.

24. An article as in claim 17 in which said substrate has surface hydroxyl, oxide or epoxy groups.

25. An article as in claim 24 in which said silicon compound is gamma-methacryloxyproyltrimethoxy silane.

26. An article as in claim 24 in which said silicon compound is vinyltrichlorosilane.

27. An article as in claim 24 in which said silicon compound is gamma-glycidoxypropyltrimethoxy silane.

28. An article as in claim 24 in which said substrate is glass.

29. An article as in claim 24 in which said substrate is metal.

30. An article as in claim 24 in which said substrate comprises epoxy resin.

References Cited

UNITED STATES PATENTS

| | | | |
|---|---|---|---|
| 3,079,361 | 2/1963 | Plueddemann | 117—72X |
| 3,342,754 | 9/1967 | Gorham | 260—2 |
| 3,395,069 | 7/1968 | Plueddemann | 117—126(GS)X |
| 3,429,739 | 2/1969 | Tittmann et al. | 117—106 |

WILLIAM D. MARTIN, Primary Examiner

R. HUSACK, Assistant Examiner

U.S. Cl. X.R.

17—75, 76, 100, 106, 124, 138.8

PO-1050
(5/69)

UNITED STATES PATENT OFFICE
CERTIFICATE OF CORRECTION

Patent No. 3,600,216 Dated August 17, 1971

Inventor(s) Donald D. Stewart

It is certified that error appears in the above-identified patent and that said Letters Patent are hereby corrected as shown below:

Column 3, line 6 --having-- should appear after "groups".

Column 4, line 44, correct the spelling of "temperature".

Column 4, lines 64-65, the structure should read $$R-\overset{\overset{\displaystyle R'_{a}}{|}}{Si}X_{3-a}$$

Column 9, line 4, correct the spelling of "methacryloxypropyltrimethoxy".

Signed and sealed this 16th day of May 1972.

(SEAL)
Attest:

EDWARD M.FLETCHER,JR.
Attesting Officer

ROBERT GOTTSCHALK
Commissioner of Patents